(12) United States Patent
Zhu et al.

(10) Patent No.: US 7,967,019 B2
(45) Date of Patent: Jun. 28, 2011

(54) METHOD AND APPARATUS FOR REMOVING CONTAMINANTS FROM SUBSTRATE

(75) Inventors: Ji Zhu, El Cerrito, CA (US); Arjun Mendiratta, Berkely, CA (US); David Mui, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 285 days.

(21) Appl. No.: 12/212,579

(22) Filed: Sep. 17, 2008

(65) Prior Publication Data
US 2009/0151754 A1 Jun. 18, 2009

Related U.S. Application Data

(60) Provisional application No. 61/013,950, filed on Dec. 14, 2007.

(51) Int. Cl.
*B08B 3/00* (2006.01)
(52) U.S. Cl. .................................. 134/95.1; 134/26
(58) Field of Classification Search .............. 134/26, 134/95.1
See application file for complete search history.

(56) References Cited

U.S. PATENT DOCUMENTS

| 4,624,890 | A | * | 11/1986 | Lloyd et al. | 442/93 |
| 5,585,034 | A | * | 12/1996 | Lysy et al. | 510/403 |
| 5,711,818 | A | * | 1/1998 | Jain | 134/6 |
| 7,279,455 | B2 | * | 10/2007 | Kieffer et al. | 510/524 |
| 2002/0046757 | A1 | * | 4/2002 | Inagaki et al. | 134/18 |
| 2005/0023246 | A1 | * | 2/2005 | McEntee et al. | 216/83 |

FOREIGN PATENT DOCUMENTS

| JP | 2003-297792 | 10/2003 |
| JP | 2007-36152 | 2/2007 |
| JP | 2007-81291 | 3/2007 |
| KR | 10-0766343 | 10/2007 |

* cited by examiner

*Primary Examiner* — Michael Barr
*Assistant Examiner* — Charles W Kling
(74) *Attorney, Agent, or Firm* — Martine, Penilla, Gencarella, LLP

(57) ABSTRACT

A cleaning material is applied to a surface of a substrate. The cleaning material includes one or more polymeric materials for entrapping contaminants present on the surface of the substrate. A rinsing fluid is applied to the surface of the substrate at a controlled velocity to effect removal of the cleaning material and contaminants entrapped within the cleaning material from the surface of the substrate. The controlled velocity of the rinsing fluid is set to cause the cleaning material to behave in an elastic manner when impacted by the rinsing fluid, thereby improving contaminant removal from the surface of the substrate.

10 Claims, 7 Drawing Sheets

Bottom View

Bottom View

METHOD AND APPARATUS FOR REMOVING CONTAMINANTS FROM SUBSTRATE

CLAIM OF PRIORITY

This application claims priority under 35 U.S.C. 119(e) to U.S. Provisional Patent Application No. 61/013,950, filed Dec. 14, 2007, entitled "Materials and Methods for Particle Removal by Single-Phase and Two-Phase Media." This provisional application is incorporated herein by reference.

CROSS-REFERENCE TO RELATED APPLICATIONS

This application is related to the following U.S. patent applications:

U.S. patent application Ser. No. 12/131,654, filed on Jun. 2, 2008, entitled "Materials for Particle Removal by Single-Phase and Two-Phase Media,"

U.S. patent application Ser. No. 12/131,660, filed on Jun. 2, 2008, entitled "Methods for Particle Removal by Single-Phase and Two-Phase Media,"

U.S. patent application Ser. No. 12/131,667, filed on Jun. 2, 2008, entitled "Apparatus for Particle Removal by Single-Phase and Two-Phase Media,"

U.S. patent application Ser. No. 11/532,491, filed on Sep. 15, 2006, entitled "Method and Material for Cleaning a Substrate,"

U.S. patent application Ser. No. 11/532,493, filed on Sep. 15, 2006, entitled "Apparatus and System for Cleaning a Substrate," and U.S. patent application Ser. No. 11/641,362, filed on Dec. 18, 2006, entitled "Substrate Preparation Using Stabilized Fluid Solutions and Methods for Making Stable Fluid Solutions."

The disclosure of each above-identified related application is incorporated herein by reference.

BACKGROUND

In the fabrication of semiconductor devices such as integrated circuits, memory cells, and the like, a series of manufacturing operations are performed to define features on semiconductor wafers ("wafers"). The wafers (or substrates) include integrated circuit devices in the form of multi-level structures defined on a silicon substrate. At a substrate level, transistor devices with diffusion regions are formed. In subsequent levels, interconnect metallization lines are patterned and electrically connected to the transistor devices to define a desired integrated circuit device. Also, patterned conductive layers are insulated from other conductive layers by dielectric materials.

During the series of manufacturing operations, the wafer surface is exposed to various types of contaminants. Essentially any material present in a manufacturing operation is a potential source of contamination. For example, sources of contamination may include process gases, chemicals, deposition materials, and liquids, among others. The various contaminants may deposit on the wafer surface in particulate form. If the particulate contamination is not removed, the devices within the vicinity of the contamination will likely be inoperable. Thus, it is necessary to clean contaminants from the wafer surface in a substantially complete manner without damaging the features defined on the wafer. However, the size of particulate contamination is often on the order of the critical dimension size of features fabricated on the wafer. Removal of such small particulate contamination without adversely affecting the features on the wafer can be quite difficult.

SUMMARY

In one embodiment, a method is disclosed for cleaning contaminants from a substrate. The method includes an operation for applying a cleaning material to a surface of a substrate. The cleaning material includes one or more polymeric materials for entrapping contaminants present on the surface of the substrate. The method also includes an operation for applying a rinsing fluid to the surface of the substrate at a controlled velocity to effect removal of the cleaning material and contaminants entrapped within the cleaning material from the surface of the substrate. The controlled velocity of the rinsing fluid is set to cause the cleaning material to behave in an elastic manner when impacted by the rinsing fluid.

In another embodiment, a system for cleaning contaminants from a substrate is disclosed. The system includes a support structure defined to support a substrate. The system also includes a cleaning material dispensing device defined to dispense a cleaning material over the support structure such that the cleaning material is applied over the substrate when present on the support structure. The system further includes a rinsing fluid dispensing device defined to direct a flow of a rinsing fluid toward the support structure such that the rinsing fluid impacts the substrate when present on the support structure. The rinsing fluid dispensing device is defined to control a flow velocity of the rinsing fluid within a velocity range which causes the cleaning material to behave in an elastic manner when impacted by the rinsing fluid.

In another embodiment, a system is disclosed for cleaning contaminants from a substrate. The system includes a support structure defined to support a substrate. The system also includes a cleaning material dispensing device defined to dispense a cleaning material over the support structure, such that the cleaning material is applied over the substrate when present on the support structure. The system further includes a proximity head disposed above the support structure, such that a bottom surface of the proximity head is exposed to a top surface of the substrate when present on the support structure. The proximity head is defined to dispense a rinsing fluid from the bottom surface of the proximity head, and apply a vacuum suction at the bottom surface of the proximity head. Dispensing of the rinsing fluid and application of the vacuum suction serves to form a fluid meniscus between the bottom surface of the proximity head and the top surface of the substrate when present on the support structure beneath the proximity head. The proximity head is defined to control a flow velocity of the rinsing fluid within a velocity range which causes the cleaning material to behave in an elastic manner when impacted by the rinsing fluid.

Other aspects and advantages of the invention will become more apparent from the following detailed description, taken in conjunction with the accompanying drawings, illustrating by way of example the present invention.

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

A method and apparatus is disclosed herein for cleaning contaminant particles from a substrate. The method includes application of a cleaning material to a surface of the substrate to be cleaned. The cleaning material is defined to entrap contaminant particles on the substrate. A rinsing fluid is applied to the substrate surface to remove the cleaning material along with the contaminant particles trapped within the cleaning material. A flow velocity of the rinsing fluid is controlled at a sufficiently high velocity such that a momentum transfer from the rinsing fluid to the cleaning material causes the cleaning material to behave in an elastic manner. Behavior of the cleaning material in an elastic manner causes the contaminant particles entrapped within the cleaning material to remain entrapped and be removed from the substrate surface along with the cleaning material, upon impact by the rinsing fluid.

A substrate, as referenced herein, denotes without limitation, semiconductor wafers, hard drive disks, optical discs, glass substrates, flat panel display surfaces, liquid crystal display surfaces, etc., which may become contaminated during manufacturing or handling operations. Depending on the actual substrate, a surface may become contaminated in different ways, and the acceptable level of contamination is defined in the particular industry in which the substrate is handled. For ease of discussion, substrate contamination is described herein by a presence of contaminant particles on the substrate surface. However, it should be understood that contaminant particles as referenced herein may take the form of essentially any type of contaminant that may contact a substrate during essentially any substrate processing and handling operation.

In various embodiments, the method and apparatus disclosed herein can be used for cleaning contaminant particles from patterned substrates and non-patterned substrates alike. In the case of patterned substrates, protruding structures on the patterned substrate surface to be cleaned may correspond to protruding lines, such as polysilicon lines or metal lines. Additionally, the patterned substrate surface to be cleaned may include recessed features, such as recessed vias resulting from a chemical mechanical planarization (CMP) process.

Figure 1A:
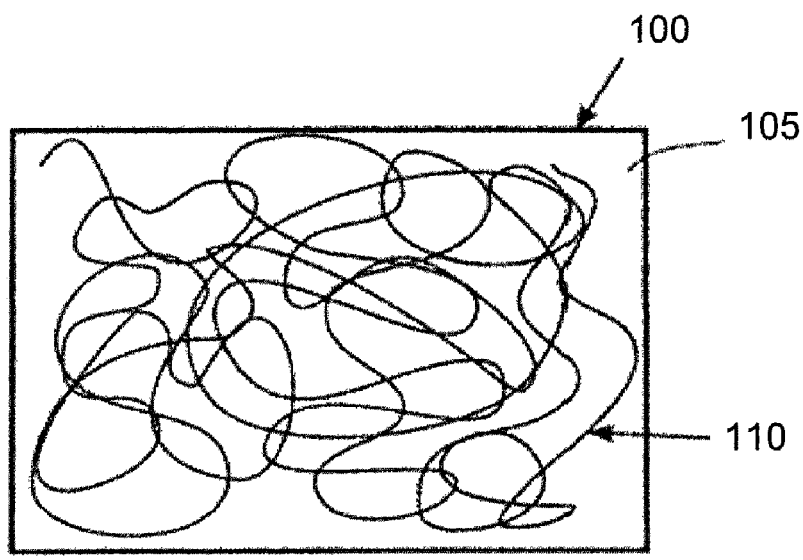
FIG. 1A shows a liquid cleaning material which includes a cleaning solution having a polymeric material distributed therein, in accordance with one embodiment of the present invention.

FIG. 1A shows a liquid cleaning material 100 which includes a cleaning solution 105 having a polymeric material distributed therein, in accordance with one embodiment of the present invention. The polymeric material is defined by polymers 110 of large molecular weight. In one embodiment, the liquid cleaning material 100 is a gel. In another embodiment, the liquid cleaning material 100 is a sol, i.e., a colloidal suspension of solid particles in a liquid. In yet another embodiment, the liquid cleaning material 100 is a liquid solution. The liquid cleaning material 100 is defined to remove contaminant particles from a substrate when applied thereto.

Figure 1B:
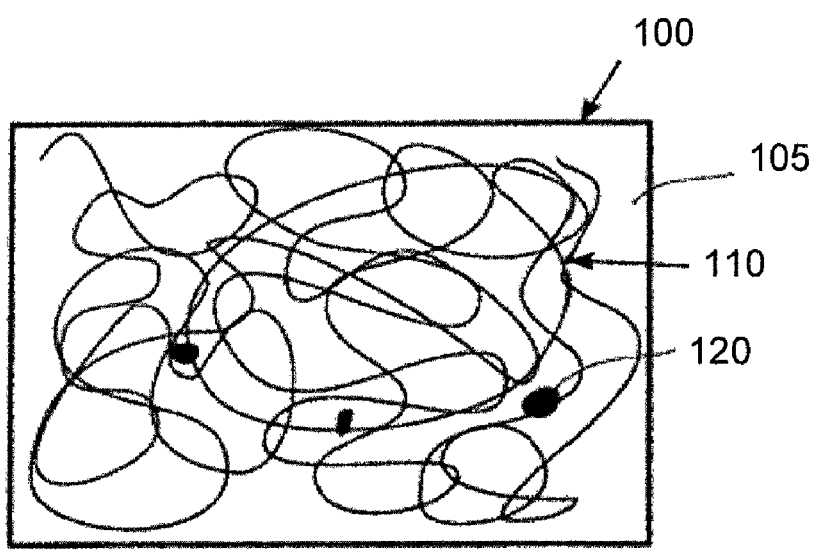
FIG. 1B shows a number of contaminant particles entrapped within the polymers of the liquid cleaning material, in accordance with one embodiment of the present invention.

FIG. 1B shows a number of contaminant particles 120 entrapped within the polymers 110 of the liquid cleaning material 100, in accordance with one embodiment of the present invention. The polymers 110 of large molecular weight (e.g., of molecular weight greater than 10,000 g/mol) form long polymer chains. These long polymer chains become intertwined with each other to form a polymeric network which functions to entrap contaminant particles on the surface of the substrate and to prevent the entrapped contaminant particles from returning to the surface of the substrate once removed therefrom.

Figure 1C:
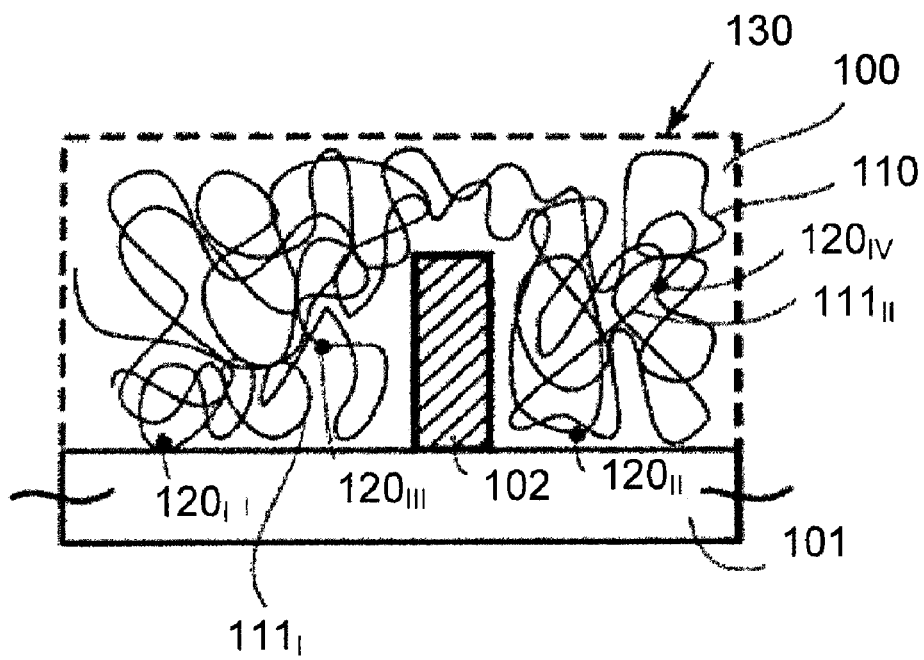
FIG. 1C illustrates how the polymers in the cleaning material can slide around device structures without exerting a damaging force on the device structures.

The polymers 110 are dissolved in the cleaning solution 105. The cleaning solution 105 includes elements that affect the pH value and enhance the solubility of the polymers 110. The polymers 110 dissolved in the cleaning solution 105 can be a soft gel or become gel-like droplets suspended in the cleaning solution 105. Also, in one embodiment, multiple types of polymers 110 can be simultaneously dissolved in the cleaning solution 105. In one embodiment, the contaminants on the substrate surface attach to the solvated polymers 110 by ionic force, van der Waals force, electrostatic force, hydrophobic interaction, steric interaction, or chemical bonding. Therefore, when the polymers 110 are placed within an interaction range about the contaminants, the polymers 110 capture and entrap the contaminants. Additionally, the liquid cleaning material 100 is formulated to be gentle on device structures present on the substrate during the cleaning process. For example, as shown in FIG. 1C, the polymers 110 in the cleaning material 100 can slide around device structures 102 without exerting a damaging force on the device structures 102.

Examples of the polymeric material having polymers of large molecular weight include, but are not limited to: a) acrylic polymers such as polyacrylamide (PAM), b) polyacrylic acid (PAA) such as Carbopol 940™ and Carbopol 941™, c) poly-(N,N-dimethyl-acrylamide) (PDMAAm), d) poly-(N-isopropyl-acrylamide) (PIPAAm), e) polymethacrylic acid (PMAA), f) polymethacrylamide (PMAAm), g) polyimines and oxides such as polyethylene imine (PEI), polyethylene oxide (PEO), polypropylene oxide (PPO) etc., h) vinyl polymers such as polyvinyl alcohol (PVA), polyethylene sulphonic acid (PESA), polyvinylamine (PVAm), polyvinyl-pyrrolidone (PVP), poly-4-vinyl pyridine (P4VP), etc., i) cellulose derivatives such as methyl cellulose (MC), ethyl-cellulose (EC), hydroxyethyl cellulose (HEC), carboxymethyl cellulose (CMC), etc., j) polysaccharides such as acacia (Gum Arabic), agar and agarose, heparin, guar gum, xanthan gum, etc., k) proteins such as albumen, collagen, gluten, etc.

With regard to exemplary polymer 110 structures, polyacrylamide (PAM) is an acrylate polymer ($-CH_2CHCONH_2-$)n formed from acrylamide subunits, wherein "n" is an integer. Polyvinyl alcohol (PVA) is a polymer ($-CH_2CHOH-$)m formed from vinyl alcohol subunits, where "m" is an integer. Polyacrylic acid (PAA) is a polymer ($-CH_2=CH\_COOH-$)o formed from acrylic acid subunits, where "o" is an integer. The polymer 110 of large molecular weight in the polymeric material is either soluble in an aqueous solution or is highly water-absorbent so as to form a soft gel in an aqueous solution. The polymers 110 can dissolve in the cleaning solution, be dispersed completely in the cleaning solution, form liquid droplets (emulsify) in the cleaning solution, or form lumps in the cleaning solution.

In one embodiment, the molecular weight of the polymeric material is greater than 100,000 g/mol. In another embodiment, the molecular weight of the polymeric material is within a range extending from about 0.1M g/mol to about 100M g/mol. In another embodiment, the molecular weight of the polymeric compound is within a range extending from about 1M g/mol to about 20M g/mol. In yet another embodiment, the molecular weight of the polymeric compound is within a range extending from about 15M g/mol to about 20M g/mol.

In one embodiment, the weight percentage of the polymers 110 in the cleaning material 100 is within a range extending from about 0.001% to about 20%. In another embodiment, the weight percentage of the polymers 110 in the cleaning material 100 is within a range extending from about 0.001% to about 10%. In another embodiment, the weight percentage of the polymers 110 in the cleaning material 100 is within a range extending from about 0.01% to about 10%. In yet another embodiment, the weight percentage of the polymers 110 in the cleaning material 100 is within a range extending from about 0.05% to about 5%.

Alternatively, the polymers 110 can be copolymers, which are derived from two or more monomeric species. For example, the copolymer molecules can include 90% of acrylamide (AM) and 10% of acrylic acid (AA). In addition, the polymers 110 can be a mixture of two or more types of polymers. For example, the polymers 110 can be made by mixing two types of polymers, such as 90% of PAM and 10% of PAA, in the solvent.

In the exemplary embodiments of FIGS. 1A-1C, the polymers 110 are dissolved uniformly in the cleaning solution 105. The base liquid, or solvent, of the cleaning solution 105 can be a non-polar liquid, such as turpentine, or a polar liquid such as water ($H_2O$). Other examples of solvent include isopropyl alcohol (IPA), dimethyl sulfoxide (DMSO), and dimethyl formamide (DMF). In one embodiment, the solvent is a mixture of two or more liquids. For polymers 110 with polarity, such as PAM, PAA, or PVA, the suitable solvent for the cleaning solution 105 is a polar liquid, such as water ($H_2O$).

In another embodiment, the cleaning solution 105 includes compounds other than the solvent, such as water, so as to modify the properties of the cleaning material 100. For example, the cleaning solution 105 can include a buffering agent, which can be a weak acid or a weak base, to adjust the potential of hydrogen (pH) value of the cleaning solution 105 and corresponding cleaning material 100. One example of the weak acid is citric acid. One example of the weak base is ammonium ($NH_4OH$). The pH value of the cleaning material 100 can range from about 1 to about 12. In one embodiment, for front-end applications (before the deposition of copper and inter-metal dielectric), the cleaning material 100 is basic with a pH value within a range extending from about 7 to about 12. In another embodiment, the pH value for front-end applications is within a range extending from about 8 to about 11. In yet another embodiment, the pH value for front-end applications is within a range extending from about 8 to about 10.

In one embodiment, for backend processing (after deposition of copper and inter-metal dielectric), the cleaning solution can be slightly basic, neutral, or acidic. In one embodiment, the pH value for backend applications is within a range extending from about 1 to about 7. In another embodiment, the pH value for backend applications is within a range extending from about 1 to about 5. In yet another embodiment, the pH value for backend applications is within a range extending from about 1 to about 2.

In one embodiment, the cleaning solution includes a surfactant, such as ammonium dodecyl sulfate (ADS) to assist with dispersion of the polymers 110 in the cleaning solution 105. In one embodiment, the surfactant also assists with wetting of the cleaning material 100 on the substrate surface. Wetting of the cleaning material 100 on the substrate surface allows the cleaning material 100 to come in close contact with the substrate surface and the contaminant particles thereon. Wetting also improves cleaning efficiency. Also, other additives can be added to improve surface wetting, substrate cleaning, rinsing, and other related properties.

In one embodiment, the cleaning solution 105 is formulated as a buffered solution. For example, the cleaning solution 105 may be defined as a buffered ammonium solution (BAS), which includes basic and acidic buffering agents, such as 0.44 wt % (weight percent) of $NH_4OH$ and 0.4 wt % of citric acid. Moreover, the buffered cleaning solution, such as BAS, can include some amount of surfactant, such as 1 wt % of ADS, to assist with suspension and dispersion of the polymers 110 in the cleaning solution 105. A cleaning solution 105 that contains 1 wt % of ADS, 0.44 wt % of NH3, and 0.4 wt % of citric acid is referred to herein as a solution "S100". Both solution "S100" and BAS have a pH value of about 10.

Figure 1D:
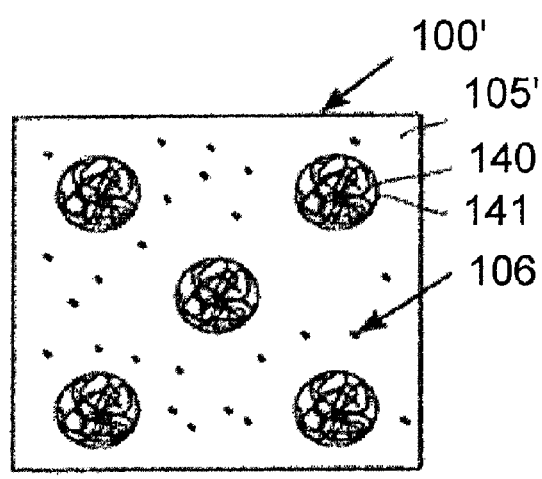
FIG. 1D shows a liquid cleaning material with gel-like polymer droplets emulsified in the cleaning solution, in accordance with one embodiment of the present invention.

FIG. 1D shows a liquid cleaning material 100' with gel-like polymer droplets 140 emulsified in the cleaning solution 105', in accordance with one embodiment of the present invention. The cleaning solution 105' can also contain small and isolated polymer 106. A surfactant, such as ADS, can be added to the cleaning solution 105' to assist with uniform dispersion of the gel-like polymer droplets 140 throughout the cleaning solution 105'. In the exemplary embodiment of FIG. 1D, a boundary 141 occurs between the cleaning solution 105' and the gel-like polymer droplets 140. The gel-like polymer droplets 140 are soft and deform around device features on the substrate surface. Because the gel-like polymer droplets 140 deform around device features, they do not exert damaging forces on the device features. In one embodiment, diameters of the gel-like polymer droplets 140 are within a range extending from about 0.1 μm (micrometer) to about 100 μm.

Figure 1E:
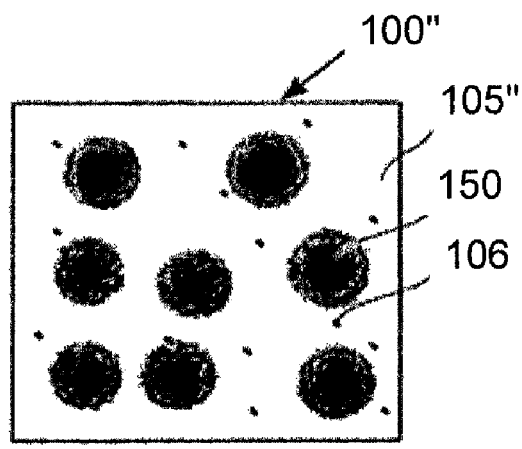
FIG. 1E shows a liquid cleaning material with polymers dissolved in a cleaning solution to form gel-like polymer lumps, which do not have distinct boundaries within the cleaning solution, in accordance with one embodiment of the present invention.

FIG. 1E shows a liquid cleaning material 100" with polymers dissolved in a cleaning solution 105" to form gel-like polymer lumps 150, which do not have distinct boundaries within the cleaning solution 105", in accordance with one embodiment of the present invention. The cleaning solution 105" can also contain small and isolated polymer 106. The gel-like polymer lumps 150 are soft and deform around device features on the substrate surface, and do not exert damaging forces on the device features. In one embodiment, diameters of the polymer lumps 150 are within a range extending from about 0.1 µm to about 100 µm.

Figure 1F:
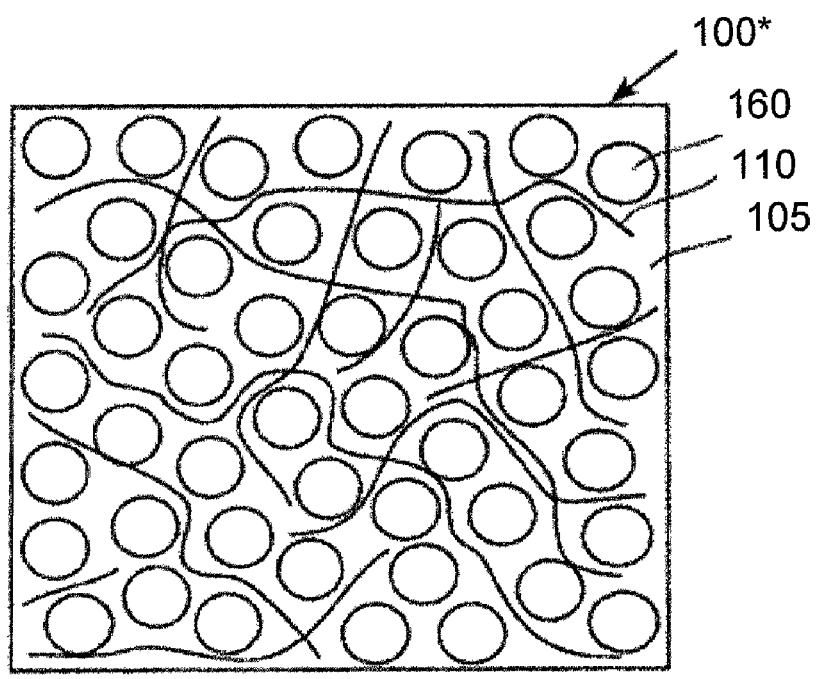
FIG. 1F shows a cleaning material having air bubbles dispersed within the cleaning solution, in accordance with one embodiment of the present invention.

The cleaning materials 100, 100', and 100" discussed above are all in liquid phase. In yet another embodiment, the cleaning materials 100, 100', and 100" can be agitated through addition of a gas, such as $N_2$, an inert gas, or a mixture of gases, such as air, to transform the cleaning materials 100, 100', and 100" into a foam. FIG. 1F shows a cleaning material 100* having air bubbles 160 dispersed within the cleaning solution 105, in accordance with one embodiment of the present invention. The cleaning material can include polymer chains 110, polymer droplets 140, or polymer lumps 150, or a combination thereof. It should be appreciated that the cleaning material 100* includes both a gas phase portion and a liquid phase portion.

As shown in FIG. 1A-1C, long chains of the high molecular weight polymers 110 form a polymeric network, which may or may not include polymer cross-linking. As shown in FIG. 1C, the polymers 110 come in contact with the contaminant particles (such as contaminant particles $120_I$ and $120_{II}$) on the substrate surface and entrap the contaminant particles. Upon removal of the contaminant particles from the substrate surface, the contaminant particles are suspended in the cleaning material 100 by way of the network of polymers 110. For example, FIG. 1C shows contaminant particles $120_{III}$ and $120_{IV}$ suspended in the cleaning material 100 by way of attachment to the polymer chains $111_I$ and $111_{II}$, respectively. It should be understood that any contaminant particle can be attached to multiple polymer chains within the polymeric network.

As discussed above, contaminant particles on the substrate become entrapped within the polymer strings/polymer network of the cleaning material. Contaminant particles entrapped within the cleaning material are removed from the substrate when the cleaning material is removed from the substrate. For example, in one embodiment, a bond between a contaminant particle and the substrate may not be broken by the cleaning material alone. In this embodiment, momentum transferred from the rinsing fluid to the cleaning material provides enough energy to break the bond between the contaminant particle and the substrate. Therefore, the efficiency of contaminant particle removal from the substrate is dependent upon the momentum of the rinsing fluid applied to remove the cleaning material from the substrate.

As discussed below, the rinsing fluid may be defined by a number of different materials of varying density. Therefore, the rinsing fluid velocity is set based on the rinsing fluid density so as to achieve a rinsing fluid momentum sufficient to remove the cleaning material and contaminant particles entrapped therein from the substrate. A higher density rinsing fluid may be applied with a lower velocity to achieve a sufficient rinsing fluid momentum. Conversely, a lower density rinsing fluid may be applied with a higher velocity to achieve a sufficient rinsing fluid momentum. The momentum of the rinsing fluid applied to the cleaning material should be large enough to cause the cleaning material to behave in an elastic manner, but should not be so large as to cause damage to the substrate or features defined thereon.

It should be understood that the momentum of the rinsing fluid is controlled primarily by the velocity of the rinsing fluid during the rinsing operation. Therefore, removal of contaminant particles from the substrate by way of the cleaning material can be controlled through appropriate setting of the rinsing fluid velocity. As mentioned above, the rinsing fluid velocity should be sufficiently high to cause the cleaning material to behave in an elastic manner, without damaging the substrate.

If the rinsing fluid velocity is too low, the momentum transfer between the rinsing fluid and cleaning material may not be sufficient to cause the polymers within the cleaning material to transfer enough force to the contaminant particles so as to break the adhesive bonds between the contaminant particles and the substrate. Also, if the rinsing fluid velocity is too low, the rinsing fluid may dilute the cleaning material, thereby allowing contaminant particles to escape from their entrapment within the polymers of the cleaning material. If the contaminant particles escape from their entrapment within the cleaning material, the cleaning material may be removed from the substrate without removing the contaminant particles from the substrate. Moreover, if the rinsing fluid velocity is too low, a residue of the cleaning material may be left on the substrate, along with contaminant particles entrapped within the residue of the cleaning material.

In view of the foregoing, it should be understood that the velocity of the rinsing fluid is a key parameter in utilizing the cleaning material to remove contaminant particles from the substrate. In one embodiment, the rinsing fluid velocity is controlled at about 1 m/s (meter per second). In another embodiment, the rinsing fluid velocity is controlled within a range extending from about 0.5 m/s to about 10 m/s. In yet another embodiment, the rinsing fluid velocity is controlled within a range extending from about 0.1 m/s to about 100 m/s.

As mentioned above, the appropriate rinsing fluid velocity depends in part on the density of the rinsing fluid, i.e., on the rinsing fluid material. The rinsing fluid material should be chemically compatible with the cleaning material and with the substrate to be cleaned. In various embodiments, the rinsing fluid can be deionized water (DIW), isopropyl alcohol (IPA), dimethyl sulfoxide (DMSO), dimethyl formamide (DMF), dimethyl acetate (DMAC), nitrogen gas, a polar solvent easy mixable with DIW, an atomized liquid such as an atomized polar solvent (e.g., DIW), or any combination thereof. It should be understood that the above-identified rinsing fluid materials are provided by way of example and do not represent an inclusive set of rinsing fluid materials.

Figure 2:
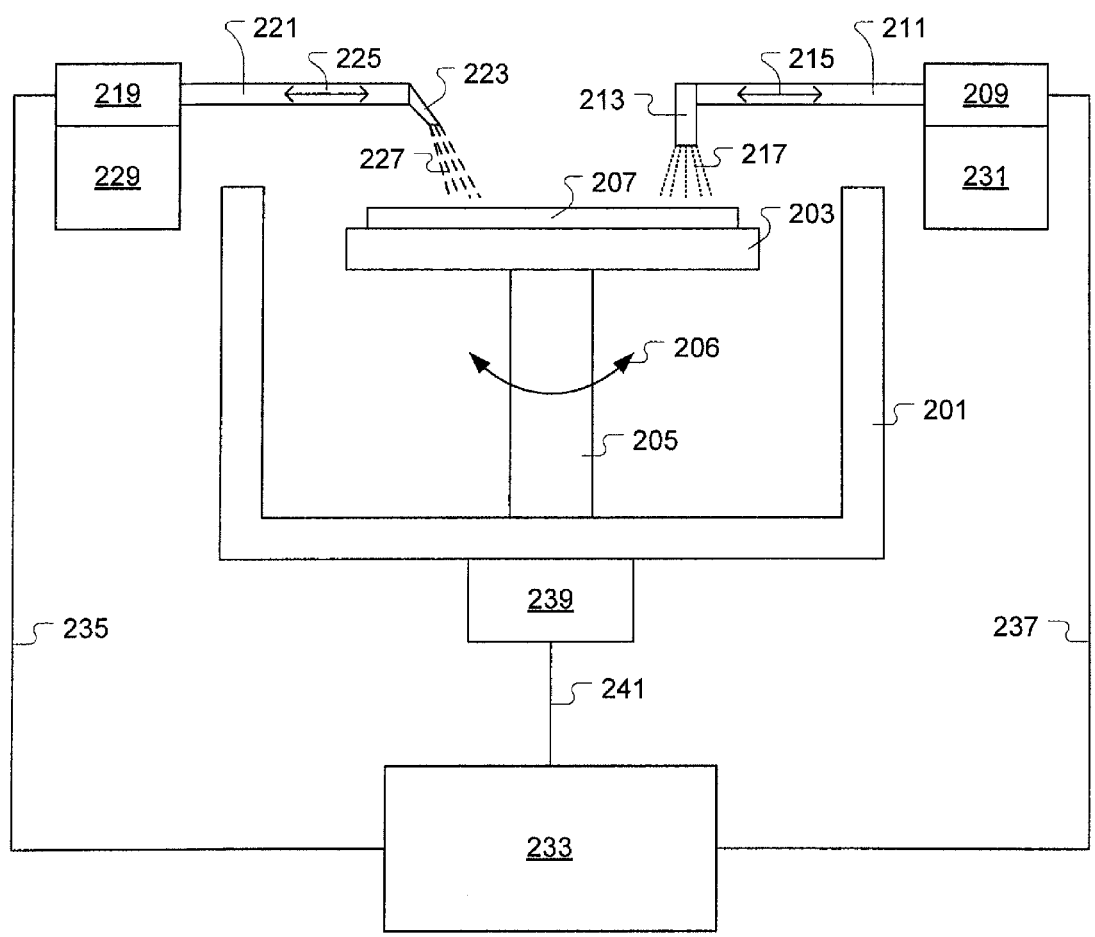
FIG. 2 is an illustration showing a system for cleaning contaminants from a substrate, in accordance with one embodiment of the present invention.

FIG. 2 is an illustration showing a system for cleaning contaminants from a substrate, in accordance with one embodiment of the present invention. The system includes a tank 201 defined to collect fluids dispensed during the substrate cleaning operation. A substrate support structure 203 is disposed within an internal volume of the tank 201. The substrate support structure 203 includes a top surface defined to receive and support a substrate 207 to be cleaned. A centroid region of a bottom surface the substrate support structure 203 is affixed to a shaft 205. The shaft 205 is connected to rotation mechanics 239, which can be operated to rotate the shaft 205, as indicated by arrows 206, so as to cause corresponding rotation of the substrate support structure 203. In one embodiment, the rotation mechanics 239 are capable of rotating the shaft 205 at a rotational frequency within a range extending from about 500 RPM (revolutions per minute) to about 4000 RPM. In another embodiment, the rotation mechanics 239 are capable of rotating the shaft 205 at a rotational frequency within a range extending from about 100 RPM to about 10000 RPM.

The system also includes a cleaning material dispensing head 213 defined to dispense cleaning material 217 toward the substrate support structure 203, and onto the substrate 207 when present on the substrate support structure 203. The cleaning material dispensing head 213 is connected in fluid communication to a cleaning material delivery control 209. The cleaning fluid delivery control 209 is defined to control a flow of cleaning material from a cleaning material reservoir 231 through a conduit 211 to the cleaning material dispensing head 213. In one embodiment, the conduit 211 is defined as a rigid component, such as a rigid pipe. In another embodiment, the conduit 211 is defined as a flexible component, such as a flexible tube. In various embodiments, the conduit 211 may be defined in a movable configuration to enable translation of the cleaning material dispensing head 213 over the substrate support structure 203 and substrate 207 thereon, as exemplified by arrows 215.

The system also includes a rinsing fluid dispensing head 223 defined to dispense rinsing fluid 227 toward the substrate support structure 203, and onto the substrate 207 when present on the substrate support structure 203. The rinsing fluid dispensing head 223 is connected in fluid communication to a rinsing fluid delivery control 219. The rinsing fluid delivery control 219 is defined to control a flow of rinsing fluid from a rinsing fluid reservoir 229 through a conduit 221 to the rinsing fluid dispensing head 223. In one embodiment, the conduit 221 is defined as a rigid component, such as a rigid pipe. In another embodiment, the conduit 221 is defined as a flexible component, such as a flexible tube. In various embodiments, the conduit 221 may be defined in a movable configuration to enable translation of the rinsing fluid dispensing head 223 over the substrate support structure 203 and substrate 207 thereon, as exemplified by arrows 225.

The rinsing fluid dispensing head 223 is configured to dispense the rinsing fluid 227 toward the substrate 207 at the necessary controlled velocity in accordance with a pressure applied to the rinsing fluid. In one embodiment, the rinsing fluid delivery control 219 is equipped with a pressure boosting device capable of increasing the pressure of the rinsing fluid 227 in the conduit 221 to a necessary pressure level. In various embodiments, the rinsing fluid dispensing head 223 can be configured as a single nozzle, multiple nozzles attached to a manifold, or a multi-port rinse head, among others. Regardless of the particular rinsing fluid dispensing head 223 embodiment, the rinsing fluid dispensing head 223 is configured to direct the rinsing fluid 227 toward the substrate 207 in a controlled pattern and with a controlled flow velocity.

In one embodiment, the system also includes a computing system 233 in electrical communication with each of the cleaning material delivery control 209, the rinsing fluid delivery control 219, and the rotation mechanics 239, through connections 237, 235, and 241, respectively. Each of the cleaning material delivery control 209, the rinsing fluid delivery control 219, and the rotation mechanics 239 can include a respective data acquisition/control device configured to receive control signals from the computing system 233 and direct operations in accordance with the received control signals. Additionally, the computing system 233 can be operated to execute a graphical user interface (GUI) defined to provide virtual controls for controlling each of the cleaning material delivery control 209, the rinsing fluid delivery control 219, and the rotation mechanics 239. Moreover, the computing system 233 by way of the GUI can be programmed to direct operation of the cleaning material delivery control 209, the rinsing fluid delivery control 219, and the rotation mechanics 239 in accordance with a prescribed substrate cleaning recipe.

In one embodiment, the computing system 233 may include a computer readable medium having computer executable program instructions stored thereon for directing operations to clean contaminants from a substrate. The computer readable medium can include program instructions to direct operation of a cleaning material dispensing device to dispense a cleaning material over a surface of a substrate. As discussed above, in one embodiment, the cleaning material is defined as a polar solvent having polyacrylamide dissolved therein for entrapping contaminants present on the surface of the substrate. The computer readable medium can also include program instructions to direct operation of a rinsing fluid dispensing device to direct a flow of a rinsing fluid toward the surface of the substrate at a controlled velocity to effect removal of the cleaning material and contaminants entrapped within the cleaning material from the surface of the substrate. The program instructions are defined to control the velocity of the rinsing fluid to cause the cleaning material to behave in an elastic manner when impacted by the rinsing fluid. Additionally, in one embodiment, program instructions are provided to direct the rotation mechanics to rotate the substrate during application of the rinsing fluid to the surface of the substrate.

Figure 3:
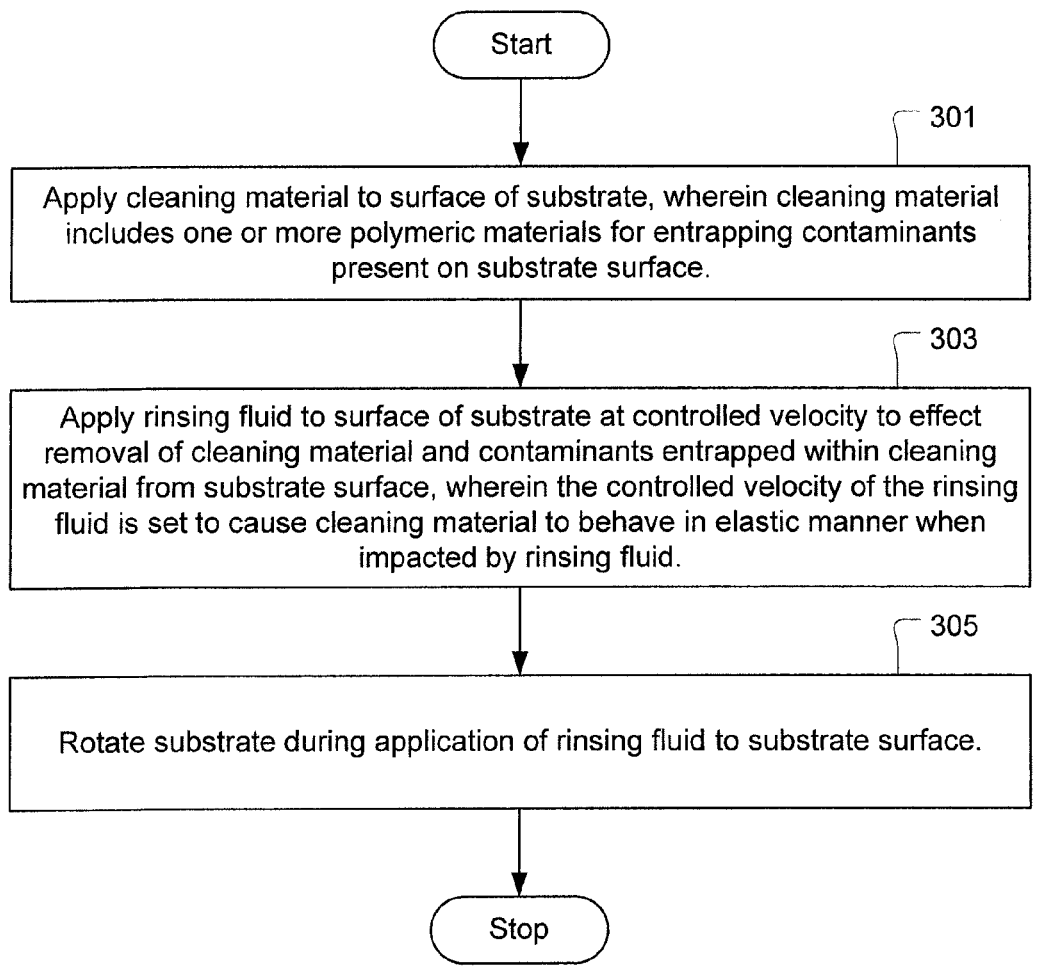
FIG. 3 is an illustration showing a method for cleaning contaminants from a substrate, in accordance with one embodiment of the present invention.

FIG. 3 is an illustration showing a method for cleaning contaminants from a substrate, in accordance with one embodiment of the present invention. The method includes an operation 301 for applying a cleaning material to a surface of a substrate. In one embodiment, the cleaning material includes one or more polymeric materials for entrapping contaminants present on the surface of the substrate. In one embodiment the cleaning material is defined as a polar solvent having polyacrylamide dissolved therein.

The method also includes an operation 303 for applying a rinsing fluid to the surface of the substrate at a controlled velocity to effect removal of the cleaning material and contaminants entrapped within the cleaning material from the surface of the substrate. The controlled velocity of the rinsing fluid is set to cause the cleaning material to behave in an elastic manner when impacted by the rinsing fluid. In one embodiment, the rinsing fluid velocity is controlled within a range extending from about 0.1 meter per second to about 100 meters per second. In another embodiment, the rinsing fluid velocity is controlled at about 1 meter per second. Due to the significant influence of the rinsing fluid momentum on the cleaning efficiency, the rinsing fluid can be applied to the surface of the substrate immediately following application of the cleaning material to the surface of the substrate.

In various embodiments, the rinsing fluid is defined as one or more of deionized water, isopropyl alcohol, dimethyl sulfoxide, dimethyl formamide, dimethyl acetate, nitrogen gas, a polar solvent, and an atomized polar solvent. Additionally, in one embodiment the rinsing fluid is dispensed from a nozzle positioned above the substrate. The nozzle can be translated over the substrate while dispensing the rinsing fluid from the nozzle.

The method may further include an operation 305 for rotating the substrate during application of the rinsing fluid to the surface of the substrate. In one embodiment, the substrate is rotated at a rate within a range extending from about 100 revolutions per minute to about 10000 revolutions per minute. It should be understood that rotation of the substrate may be utilized in some embodiments, but is not required for all embodiments.

The above-mentioned computer readable medium is any data storage device that can store data which can be thereafter be read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. Additionally, as mentioned above, a graphical user interface (GUI) implemented as computer readable code on a computer readable medium can be developed to provide a user interface for performing any embodiment of the present invention.

Figure 4A:
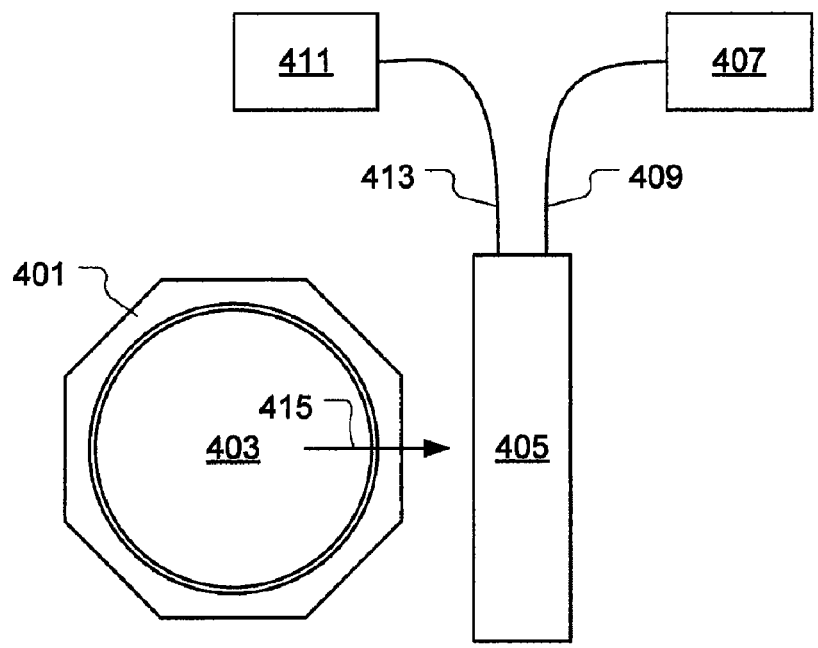
FIG. 4A shows a proximity head system defined to apply the rinsing fluid to the surface of the substrate at the controlled velocity to effect removal of the cleaning material and contaminants entrapped therein, in accordance with one embodiment of the present invention.

Although the exemplary embodiment discussed above with regard to FIG. 2 shows the rinsing fluid dispensing head 223 connected through conduit 221 to rinsing fluid delivery control 219, it should be understood that other rinsing fluid dispensing configurations may be used to dispense the rinsing fluid onto the substrate. For example, FIG. 4A shows a proximity head system 400 defined to apply the rinsing fluid to the surface of the substrate at the controlled velocity to effect removal of the cleaning material and contaminants entrapped therein, as described above with regard to operation 303, in accordance with one embodiment of the present invention.

The system 400 includes a proximity head 405 and a substrate holder 401. In one embodiment, the proximity head 405 is disposed in a stationary manner, and the substrate holder 401 is defined to transport a substrate 403 held thereon under the proximity head 405, as indicated by arrow 415. However, it should be understood that in other embodiments, the substrate holder 401 may be stationary, and the proximity head 405 may be moved over the substrate holder 401. Also, in one embodiment, the proximity head 405 is defined to span a diameter of the substrate 403, such that one pass of the substrate holder 401 beneath the proximity head 405 will expose an entirety of a top surface of the substrate 403 to processing by the proximity head 405.

The system 400 also includes a rinsing fluid supply 407 defined to supply a controlled flow of rinsing fluid 227 through a conduit 409 to the proximity head 405. The system 400 further includes a vacuum source 411 defined to apply a vacuum through a conduit 413 to the proximity head 405. The proximity head 405 is defined to apply the rinsing fluid 227 to the top surface of the substrate 403 at a controlled velocity to effect removal of the cleaning material and contaminants entrapped therein. The proximity head 405 is also defined to remove the applied rinsing fluid, cleaning material, and contaminants entrapped therein from the top surface of the substrate 403 by way of the vacuum source 411.

Figure 4B:
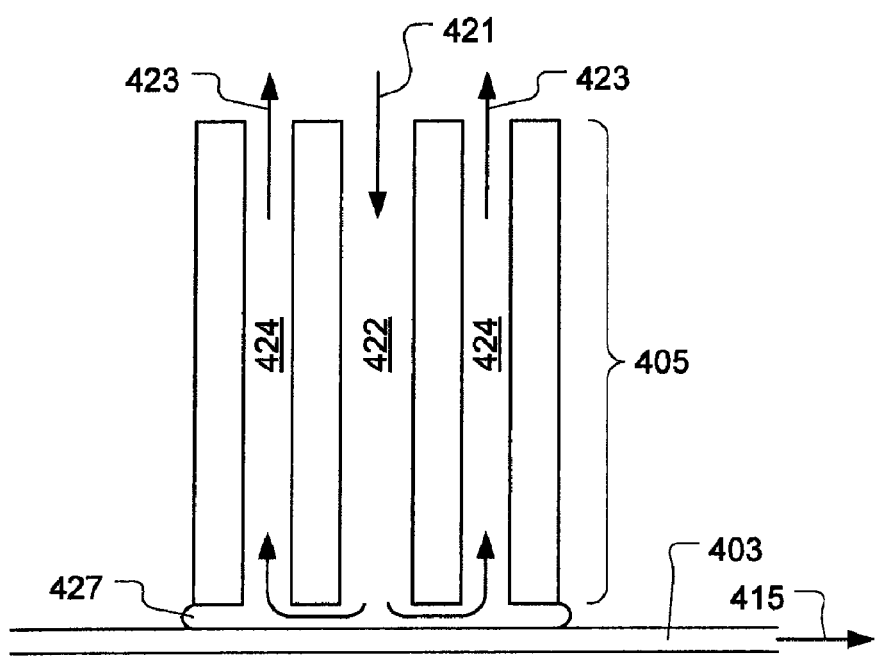
FIG. 4B is an illustration showing a cross-section view of the proximity head positioned over the substrate, in accordance with one embodiment of the present invention.

FIG. 4B is an illustration showing a cross-section view of the proximity head 405 positioned over the substrate 403, as the substrate 403 is moved in the direction 415 beneath the proximity head 405, in accordance with one embodiment of the present invention. The proximity head 405 is defined to include one or more centrally located rinsing fluid dispense ports 422, through which the rinsing fluid 227 is flowed toward the substrate 403, as indicated by arrow 421. In one embodiment, the rinsing fluid dispense ports 422 are centrally located on a bottom surface of the proximity head 405, wherein the bottom surface of the proximity head 405 is to face the top surface of the substrate 403. The proximity head 405 is also defined to apply vacuum from the vacuum source 411 to a number of vacuum ports 424 defined around the rinsing fluid dispense ports 422 and about a periphery of the bottom surface of the proximity head 405. In this manner, the applied rinsing fluid 227, the cleaning material, and the contaminants entrapped therein are transported away from the top surface of the substrate 403 through the vacuum ports 424, as indicated by arrows 423.

The flow of rinsing fluid 227 through the rinsing fluid dispense ports 422 and the vacuum applied to the vacuum ports 424 are controlled to form and maintain a fluid meniscus 427 between the bottom surface of the proximity head 405 and the top surface of the substrate 403. In one embodiment, the rinsing fluid 227 is controlled to flow through the rinsing fluid dispense ports 422 at a flow rate within a range extending from about 1 liter per minute to about 4 liters per minute. It should be understood that the size of the rinsing fluid dispense ports 422 is defined to provide sufficient flow of rinsing fluid 227 so as to transfer sufficient momentum from the rinsing fluid 227 to the cleaning material present on the top surface of the substrate 403, such that the cleaning material is removed from the substrate 403 with the contaminants remaining entrapped within the cleaning material. It should be further understood that the vacuum suction is controlled to compensate for the flow of rinsing fluid 227 through the proximity head 405 to the substrate 403, so as to maintain the meniscus 427.

Figure 4C:
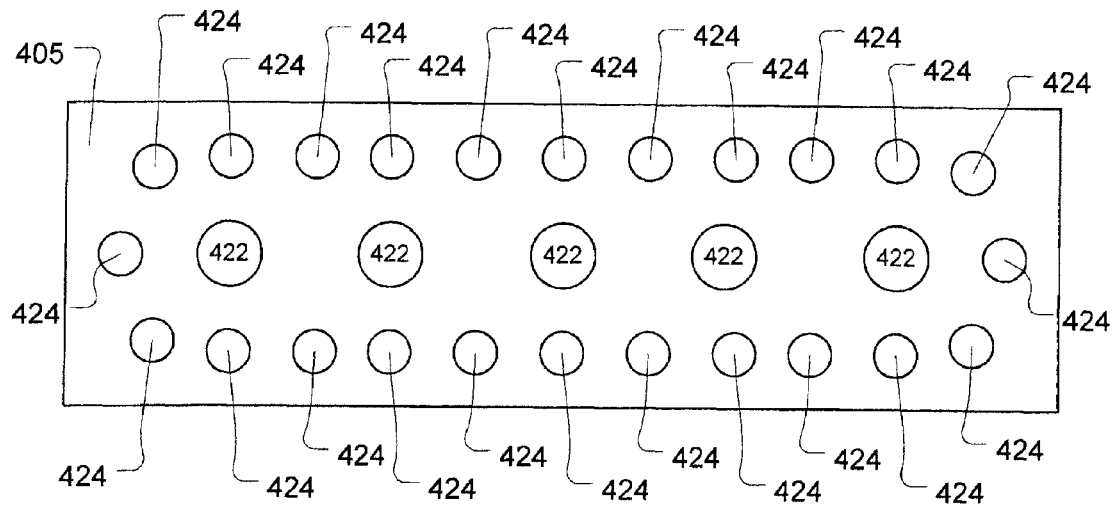
FIG. 4C is an illustration showing a bottom view of the proximity head, in accordance with one embodiment of the present invention.

FIG. 4C is an illustration showing a bottom view of the proximity head 405, in accordance with one embodiment of the present invention. In this embodiment, the rinsing fluid dispense ports 422 are defined as a number of holes centrally located along the length of the proximity head 405. Also, in this embodiment, the vacuum ports 424 are defined as a number of holes disposed around the rinsing fluid dispense ports 422 and about a periphery of the bottom surface of the proximity head 405.

Figure 4D:
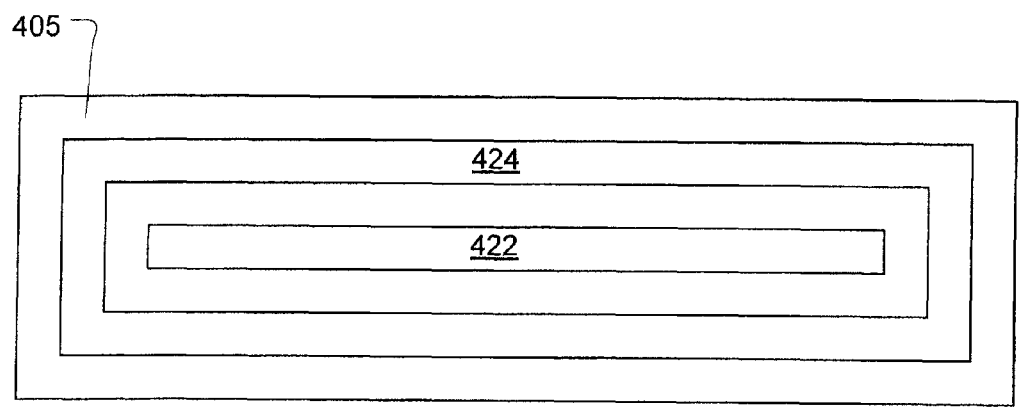
FIG. 4D is an illustration showing a bottom view of the proximity head, in accordance with another embodiment of the present invention.

FIG. 4D is an illustration showing a bottom view of the proximity head 405, in accordance with another embodiment of the present invention. In this embodiment, the rinsing fluid dispense port 422 is defined as a continuous channel centrally located along the length of the proximity head 405. Also, in this embodiment, the vacuum port 424 is defined as a continuous annular channel disposed around the rinsing fluid dispense port 422 and about a periphery of the bottom surface of the proximity head 405. It should be understood that the embodiments disclosed with regard to FIGS. 4C and 4D are provided by way of example, and are not intended to represent an inclusive set of possible configurations for the rinsing fluid dispense ports 422 and vacuum ports 424. In other embodiments, the rinsing fluid dispense ports 422 and vacuum ports 424 of the proximity head 405 may be configured in essentially any manner that provides for: 1) sufficient controlled flow of the rinsing fluid 227 to the substrate 403 so as to remove the cleaning material and contaminants entrapped therein from the substrate 403, and 2) maintaining the meniscus 427 is a controlled manner.

While this invention has been described in terms of several embodiments, it will be appreciated that those skilled in the art upon reading the preceding specifications and studying the drawings will realize various alterations, additions, permutations and equivalents thereof. Therefore, it is intended that the present invention includes all such alterations, additions, permutations, and equivalents as fall within the true spirit and scope of the invention.

What is claimed is:

1. A system for cleaning contaminants from a substrate, comprising:
   a support structure defined to support a substrate;
   a cleaning material reservoir;
   a cleaning material disposed within the cleaning material reservoir, wherein the cleaning material is a polar solvent having polyacrylamide dissolved therein for entrapping contaminants present on a surface of the substrate;

a cleaning material dispensing device connected in fluid communication with the cleaning material reservoir and defined to dispense the cleaning material over the support structure such that the cleaning material is applied onto the substrate when present on the support structure; and a rinsing fluid dispensing device defined to direct a flow of a rinsing fluid toward the support structure such that the rinsing fluid impacts the cleaning material when present on the support structure, wherein the rinsing fluid dispensing device is defined to control a flow velocity of the rinsing fluid within a velocity range extending from about 0.1 meter per second to about 100 meters per second.

2. A system as recited in claim 1, wherein the rinsing fluid is deionized water.

3. A system as recited in claim 1, further comprising:

a computing system in electrical communication with each of the cleaning material dispensing device and the rinsing fluid dispensing device, wherein each of the cleaning material dispensing device and the rinsing fluid dispensing device is defined to receive control signals from the computing system and respectively direct cleaning material deposition and rinsing fluid deposition operations in accordance with the received control signals.

4. A system as recited in claim 3, further comprising:

a shaft connected to a centroid region of a bottom surface of the support structure; and rotation mechanics connected to the shaft and defined to rotate the shaft at a controlled rotational rate so as to cause corresponding rotation of the support structure, wherein the rotation mechanics are in electrical communication with the computing system, wherein the rotation mechanics are defined to receive control signals from the computing system and direct rotation of the shaft and support structure connected thereto in accordance with the received control signals.

5. A system as recited in claim 4, wherein the rotation mechanics are configured to rotate the shaft and support structure connected thereto at a rate within a range extending from about 100 revolutions per minute to about 10000 revolutions per minute.

6. A system as recited in claim 1, wherein the cleaning material is defined as a polar solvent having polyacrylamide dissolved therein.

7. A system as recited in claim 1, wherein the rinsing fluid dispensing device is defined to control the flow velocity of the rinsing fluid at about 1 meter per second.

8. A system as recited in claim 1, wherein rinsing fluid is defined as one or more of deionized water, isopropyl alcohol, dimethyl sulfoxide, dimethyl formamide, dimethyl acetate, nitrogen gas, a polar solvent, and an atomized polar solvent.

9. A system as recited in claim 1, wherein the rinsing fluid dispensing device includes a nozzle positioned above the substrate from which the flow of rinsing fluid is directed toward the support structure.

10. A system as recited in claim 9, wherein the rinsing fluid dispensing device is defined to translate the nozzle over the substrate.

* * * * *